POWER SUPPLIES FOR USE IN THERMOELECTRIC REFRIGERATION SYSTEMS

Filed Feb. 9, 1960

*INVENTOR.*
ADDISON C. SHECKLER
*BY* Herman Seid
*ATTORNEY.*

United States Patent Office 3,005,316
Patented Oct. 24, 1961

3,005,316

POWER SUPPLIES FOR USE IN THERMOELECTRIC REFRIGERATION SYSTEMS

Addison C. Sheckler, Cato, N.Y., assignor to Carrier Corporation, Syracuse, N.Y., a corporation of Delaware Filed Feb. 9, 1960, Ser. No. 7,665
8 Claims. (Cl. 62—3)

This invention relates to a method and means for the conversion of an alternating current to unidirectional current and more particularly to the conversion of single-phase alternating current into a polyphase alternating current which may be adapted to be rectified to provide a relatively ripple free unidirectional current output from the rectifier for use in thermoelectric heating and cooling systems including air conditioning and refrigeration applications. This invention further relates to an improved means for converting single-phase alternating current into a polyphase alternating current.

In recent years, considerable interest has surrounded the feasibility of utilizing thermoelectric elements as a means for heating or cooling an area to be refrigerated or air conditioned. The increasing availability of semi-conducting materials suitable for use in the production of thermoelectric junctions having excellent heat pumping characteristics has intensified interest in this field. However, a serious obstacle to the effective use of thermoelectric materials in the field of air conditioning and refrigeration arises because of the desirability of supplying a substantial amount of power to the thermoelectric junctions at a relatively low voltage and consequently a relatively high current.

In order to produce effective cooling of an area, for example in a refrigerator, by a thermoelectric device which is capable of being installed in the average home, it is generally necessary to supply the power required for operation of the device from a standard single-phase alternating current line, such as is generally available in homes. On the other hand, the power required by a thermoelectric device of the type described must be supplied to the device in the form of unidirectional current. The amount of cooling which is provided by a thermoelectric device of the type described is proportional to the current which flows through the thermoelectric elements of the device. On the other hand, the current flowing through the thermoelectric elements tends to heat them due to their inherent resistance, and the resistive heating so produced is proportional to the square of the current which flows through the thermoelectric elements. Consequently, an operating point is reached where increased current through the thermoelectric elements produces relatively more heating than cooling and the overall cooling capacity of the thermoelectric device decreases. In effect, ripple in the current supplied to the thermoelectric elements constitutes an instantaneous increase in voltage which may therefore materially degrade the performance of the entire device by exceeding the optimum design current. In order to effectively utilize a thermoelectric device, it is often desirable to operate at the point of maximum cooling capacity and ripple therefore becomes a serious limitation on the effectiveness of a thermoelectric cooler. It is also common to operate a thermoelectric device at the point of maximum efficiency (maximum co-efficient of performance) and here again ripple seriously degrades the performance of the device by deviating from the desired design point.

It is necessary, therefore, that the unidirectional current supplied to a thermoelectric device be extremely uniform and free of ripple in order to produce efficient cooling of an area to be conditioned. However, while it is relatively simple to inexpensively filter a high voltage at a relatively low current, the costs of the components necessary to effectively filter a low voltage being supplied at a relatively high current makes a thermoelectric system of the type described economically unattractive. Conventional full-wave rectification of a single-phase current source, such as is provided by a stepdown transformer connected across a power line, provides a relatively high ripple component necessitating the use of capacitor banks having many thousands of microfarads of capacitance in order to bring the ripple component of the rectified current down to an acceptably satisfactory value for use in a thermoelectric refrigeration system which may require, for example, a supply voltage of about ten volts at a current of ten amperes.

One approach to the thermoelectric power supply problem involves the connection of the large number of thermoelectric elements each requiring a small voltage in series so that a higher voltage supply may be used to provide the requisite power. This solution, however, has the serious disadvantage that the failure of a single element or junction in the series will produce failure of the entire series and consequently the whole device. From a standpoint of reliability, it is far more desirable to connect the thermoelectric junction forming elements in parallel with one another so that the failure of a few thermoelectric elements or junctions will not materially disrupt the operation of the thermoelectric device. In addition, even if the thermoelectric elements of a small thermoelectric device such as a household refrigerator are all connected in series, the voltage drop across the series is still so small that a relatively low voltage power supply must be employed to supply current to the thermoelectric device. This means that relatively large capacitors are still required to provide the requisite ripple attenuation for effective operation of the device. A further solution to the problem is to reduce the cross-section of the thermoelectric elements thereby increasing their resistance and consequently the voltage drop across the series. However, this scheme is thwarted in actual practice by the inherent brittleness of the semi-conducting materials which comprise thermoelectric elements which increase the likelihood of failure of one of them and hence, of the entire device.

It is well known that the rectified unidirectional current output of a polyphase alternating current rectifier when used with a balanced polyphase input to the rectifier provides a very small percentage of undesirable ripple with respect to the total voltage output of the rectifier. It would be desirable, therefore, to convert the single-phase line current available in most homes to a balanced polyphase alternating current, rectify the polyphase current by means of a full-wave polyphase rectifier, filter the rectified current and supply the same to the thermoelectric device. Since the percentage of ripple contained in the output current of a polyphase rectifier is relatively small to start with, a relatively small and inexpensive capacitor or other filter circuit may be used, if desired, to supply the thermoelectric device with current having the desired uniformity and freedom from ripple. In addition, the ripple frequency of a rectified polyphase current is higher than that of a rectified single-phase current and consequently less capacitance is needed to reduce ripple to a given percentage thereby still further reducing size and cost of the thermoelectric device.

The devices heretofore available for conversion of single-phase alternating current into a balanced three-phase alternating current such as rotary converters have required expensive machinery or complex circuitry, the size, installation and maintenance cost of which largely or totally offsets the desirability of using them. It is apparent, therefore, that a need exists for a simple, inexpensive device for converting single-phase current into polyphase current using passive components having no moving parts to get out of order.

Accordingly, it is an object of this invention to provide an improved thermoelectric heating or cooling system which is operable from a single-phase source of alternating current.

It is a further object of this invention to provide an improved power supply which is capable of supplying relatively ripple free unidirectional current from a single-phase alternating current source and which uses relatively small passive components which require a minimum of space and which enable the power supply to be manufactured at a relatively small cost.

It is a still further object of this invention to provide an improved electrical phase-splitting circuit to convert single-phase alternating current to a balanced polyphase alternating current.

It is a still further object of this invention to provide an improved method of operating a thermoelectric device.

These and other objects of this invention are achieved in the illustrated embodiments by connecting a thermoelectric device having a substantially predetermined impedance to a power supply. The power supply comprises a phase-splitting section and a rectifying section. The phase-splitting section is adapted to convert single-phase alternating current, such as may be available from ordinary house lines, into a polyphase alternating current. The polyphase alternating current is rectified by a polyphase rectifier in the rectifier section. The unidirectional current output of the rectifier section is conducted to the thermoelectric device. The method of this invention involves converting a single-phase alternating current into a polyphase alternating current, rectifying the polyphase alternating current by a polyphase rectifier and conducting the unidirectional current output of the polyphase rectifier to the thermoelectric device.

These and other objects of this invention will become apparent by reference to the following specification and attached drawings in which.

Figure 1:
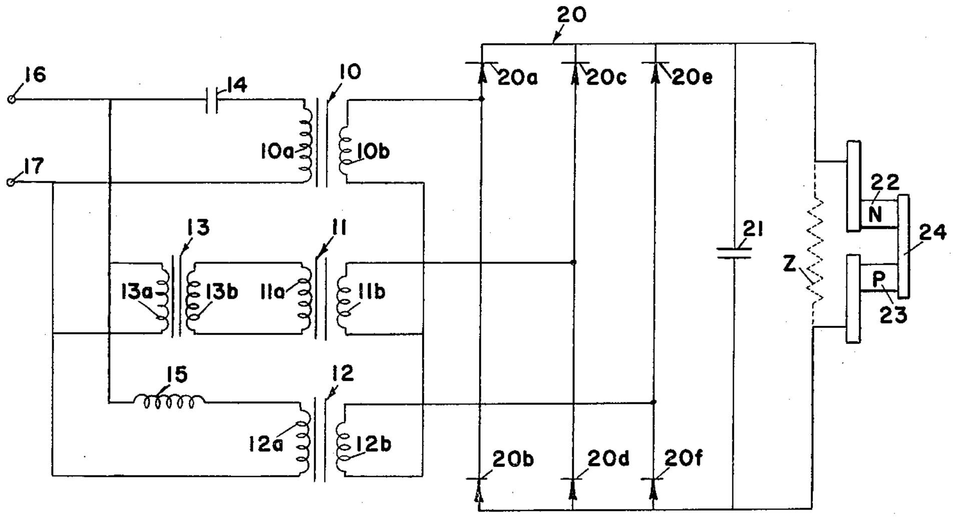
FIGURE 1 is a schematic diagram of one embodiment of this invention.

Referring particularly to FIGURE 1, there is shown a schematic diagram of a phase-splitting network, a rectifier section and a thermoelectric device in accordance with this invention. The phase-splitting network or section comprises a first transformer 10, a second transformer 11, a third transformer 12 and a fourth transformer 13. A capacitor 14 and an inductor 15 are connected as shown in the illustration to complete the phase-splitting network. It will be appreciated that while the parts shown in the illustrations of this invention are referred to by the common electrical names, such as a "capacitor," that any means having the essential electrical characteristics of the device named e.g., capacitance, is intended to be included by the various component terms mentioned.

The first transformer 10 has a primary winding 10*a* and secondary winding 10*b*. Primary winding 10*a* has a pair of terminals which comprise the electrical ends or leads of the primary winding of the transformer. It will be understood that the expression "terminal" as used in this specification is intended to define the electrical point at which a connection is made to the component and that considerations of availability or cost may dictate that this connection be a tap on a transformer winding rather than its physical end, for example.

The terminals of primary winding 10*a* are connected in series with capacitor 14 and terminals 16 and 17. Hence, a first terminal primary winding 10*a* is connected to a first terminal or plate of capacitor 14 and the second terminal of winding 10*a* and the second terminal or plate of capacitor 14 are connected to terminals 17 and 16 respectively. Terminals 16 and 17 comprise means adapted to be connected to single-phase source of alternating current such as might normally be found in a residence. The fourth transformer 13 has a primary winding 13*a* and a secondary winding 13*b*. The terminals of primary winding 13*a* are connected directly to terminals 16 and 17 thereby placing primary winding 13*a* in parallel across the source of single-phase alternating current referred to. The terminals of secondary winding 13*b* of the fourth transformer are connected to the terminals of 11*a* of second transformer 11. The terminals of primary winding 12*a* are connected in series with the terminals of inductor 15 and the terminals 16 and 17. Consequently, a first terminal of primary winding 12*a* is connected to a first terminal of inductor 15 and a second terminal of winding 12*a* and a second terminal of inductor 15 are connected to terminals 17 and 16 respectively.

One terminal of each of the secondary windings, 10*b*, 11*b* and 12*b* of the first, second and third transformers respectively may be electrically connected to form a common or neutral point of a polyphase system as shown in the drawing. The other terminals of secondary windings 10*b*, 11*b* and 12*b* comprise the polyphase current output terminals of the phase-splitting network thus comprising a three-phase Y connection and are connected to polyphase rectifier 20. Obviously, a three-phase delta or other connection may be used instead of that shown, if desired.

Polyphase rectifier 20 comprises a plurality of diodes 20*a*, 20*b*, 20*c*, 20*d*, 20*e*, and 20*f* and are electrically connected to form a three-phase, full-wave rectifier section as schematically shown in the illustration. If desired, filter means, schematically shown as comprising a capacitor 21, may be connected across the output terminals of polyphase rectifier 20 to provide additional ripple attenuation. It will be understood that the filter may comprise other components such as inductors or resistors in a suitable network.

A thermoelectric device comprising a pair of thermoelectric elements 22 and 23 electrically connected by a jumper 24 is connected across the output terminals of polyphase rectifier 20. A thermoelectric device of the character referred to may comprise a household refrigerator, air conditioner or heater, for example. It will be understood that thermoelectric devices of this character employ thermoelectric elements having dissimilar thermoelectric powers. Thermoelectric elements composed of lead telluride or bismuth telluride with an appropriate doping agent to give them N-type conductivity and P-type conductivity are suitable examples which are useable in connection with this invention.

For example, thermoelectric element 22 may have N-type conductivity and is joined by jumper 24 to thermoelectric element 23 having P-type conductivity to produce Peltier cooling or other desired thermoelectric effect.

First, second, third and fourth transformers 10, 11, 12 and 13 together with capacitor 14 and inductor 15 comprise a phase-splitting network which is adapted to convert a single-phase source of alternating current connected to terminals 16 and 17 into a polyphase alternating current due to phase shifts caused by the proper selection of component values such that the primary currents bear a 120° phase relation to each other. Under certain circumstances, fourth transformer 13 and second transformer 11 may be omitted if it is not necessary to isolate the power supply from the alternating current line. Alternatively, transformer 13 may be omitted and transformers 10 and 12 may comprise autotransformers. It has been found that the proper selection of component values for capacitor 14 and inductor 15 may be chosen for a particular load impedance and a particular set of transformers to provide a substantially balanced polyphase output from the phase-shifting network. A thermoelectric device may be regarded under normal operating conditions to present a substantially constant predetermined load impedance, schematically designated as Z in the drawings, making feasible the use of a phase-splitting network of the character described.

In order to approach the theoretical minimum of ripple existing in the output of rectifier 20, it is necessary to select the component values so that a substantially balanced polyphase output is supplied to the rectifier. Because of switching transients or other nonuniform characteristics of the diodes which comprise the polyphase rectifier, it may be necessary to somewhat modify the values of the components to substantially approach the optimum ripple attenuation in the unidirectional current output of the rectifier section. It is desirable, for transformers 10, 11 and 12 to have equal secondary voltages. While a rigid mathematical analysis of the circuitry involved in this invention is somewhat complex, it has been found practical to employ analogue techniques in the selection of component values.

The power supply of this invention provides relatively ripple free unidirectional current to the thermoelectric devices comprising desired load because of the low characteristic ripple in the output of a full-wave polyphase rectifier. It has been found that a balanced three-phase, full-wave rectifier output and a reasonably small filter capacitor provides sufficiently low ripple to be utilized effectively with a thermoelectric device but it is obvious that higher phase numbers than three may be utilized if further ripple attenuation is required. Filter capacitor 21 may effectively be made smaller as the number of phases which are rectified is increased to provide a given ripple percentage in the unidirectional current supplied to the thermoelectric device because of the higher ripple frequency and the lower ripple percentage in the output of such a system. Full-wave rectification is desirable for this reason but not required if a sufficiently large number of phases are rectified.

Figure 2:
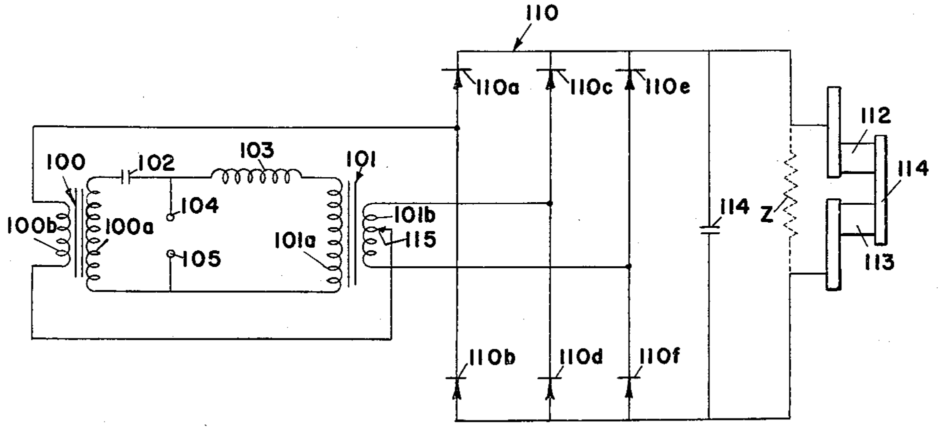
FIGURE 2 is a schematic diagram of a modified embodiment of this invention.

FIGURE 2 shows a modified embodiment of this invention which employs a first transformer 100 and second transformer 101. Terminals of the primary winding 100*a* are connected in series with the terminals or plates of capacitor 102 and terminals 104 and 105. Terminals 104 and 105 are adapted to be connected to a source of single-phase alternating current. One terminal of primary winding 101*a* of second transformer 101 is connected to the terminal of primary winding 100*a* which is connected to alternating current source terminal 105. The other terminal of primary winding 101*a* is connected in series with the terminals of inductor 103 and terminal 104 of the source of alternating current as illustrated in the drawing.

One terminal of secondary winding 100*b* of second transformer 100 is connected to a centertap 115 on secondary winding 101*b* on second transformer 101. The remaining terminal of secondary winding 100*b* as well as the terminals of secondary winding 101*b* comprise a three-phase alternating current output which is conducted to the input terminals of polyphase rectifier section 110. Transformers 100 and 101 have specially related secondary windings 100*b* and 101*b* such that the voltage at the terminals of winding 100*b* is $\frac{1}{2}\sqrt{3}$ times the full voltage at the terminals of winding 101*b* or, in other words, the voltage at the terminals of winding 100*b* is $\sqrt{3}$ times the voltage from the centertap to either terminal of winding 101*b*.

Polyphase rectifier section 110 comprises diode 110*a*, 110*b*, 110*c*, 110*d*, 110*e*, 110*f*, connected as illustrated in the drawing. Rectifier section 110 comprises a full-wave, three-phase rectifier which characteristically has substantially lower ripple output than a full-wave, single-phase rectifier. The output terminals of rectifier section 110 are connected to a thermoelectric device which may comprise a pair of thermoelectric elements 112 and 113 of dissimilar thermoelectric character which are connected together by a junction 114. Further ripple attenuation may be achieved by connecting filter network, schematically shown as comprising a capacitor 114, across the output terminals of polyphase rectifier 110.

The values of the components which comprise the power supply illustrated in FIGURE 2 are selected in the manner described in connection with the preceding embodiment so that the phase-splitting network provides a substantially balanced three-phase current to rectifier section 110. When a substantially balanced polyphase current is supplied to rectifier section 110, the percentage of ripple in the current supplied to the thermoelectric device is substantially at a minimum. It will be understood that the impedance Z of the thermoelectric device must be taken into consideration in the selection of component values in order to balance the currents in each leg of the output of the phase-splitting network. Capacitor 102 and inductor 103 serve to shift the phase relationships of the currents flowing in windings 100*b* and 101*b* so that they assume a quadrature relationship for the particular load impedance Z which is employed. Consideration of rectifier characteristics may require changes in component values to give minimum ripple and it is desirable to select values for the components which give substantially minimum ripple for a particular system.

It will be appreciated that one of the "terminals" of the secondary winding 100*b* may actually comprise a tap placed at the appropriate point on a secondary winding to produce the voltage relationship with secondary winding 101*b* which has been previously described.

While both embodiments of this invention shown in the drawing illustrate the conversion of a single-phase alternating current to a three-phase alternating current, it will be appreciated that higher phase numbers than three may be advantageously employed to secure still further ripple attenuation with a filter network of a given size. It will also be understood that when using phase numbers higher than three, that an appropriate modification may desirably be made to the rectifier section to achieve full-wave rectification of the polyphase current supplied to it. The number of phases employed is not critical but it is essential that the source of alternating current employed should be split into a higher number of phases and each of those phases subsequently rectified to provide a relatively small ripple at a relatively higher frequency thereby reducing the size of the filter components which are required to achieve the desired ripple attenuation to operate the thermoelectric device at the desired design point.

If still more ripple attenuation is desired than can be economically achieved by the three-phase systems illustrated in FIGURES 1 and 2, a six-phase system may be easily constructed embodying the principles of this invention. For example, if each of the transformers 10, 11, and 12 or 100 and 101 have an additional secondary winding which are electrically similar to the secondary windings illustrated, a second balanced three-phase output current may be taken from the additional windings. By proper connection, the second three-phase output current will be substantially 180° out of phase with the first three-phase output and consequently a balanced six-phase system is thereby provided. Other modifications within the scope of this invention will occur to those skilled in the art from the foregoing description.

It will be observed that all of the components employed in the system described are static or passive in the sense that they have no moving parts which require maintenance and that the power supply is simple and capable of being inexpensively manufactured from standard parts. Further, the failure of a part may be repaired quickly by replacement of the defective part the cost of which should be relatively low in comparison with rotary converters. Likewise, any convenient voltage may be supplied to operate the thermoelectric device so that the designer may use whatever combinations of thermoelectric elements he desires without the necessity of connecting large numbers of them in series to obtain a high voltage drop across them.

While I have described a preferred embodiment of the invention, it will be appreciated the invention is not so limited since it may be otherwise embodied within the scope of the following claims.

I claim:

1. A thermoelectric refrigeration system adapted to operate from standard single phase house current, comprising a plurality of electrically connected thermoelectric elements and a power supply for providing a unidirectional current to said thermoelectric elements to achieve a refrigeration effect, said power supply comprising a phase-splitting network for converting a single-phase alternating current to a polyphase alternating current and a full-wave polyphase rectifier for rectifying said polyphase current and providing unidirectional current having a low ripple percentage to said thermoelectric elements.

2. A power supply for providing direct current having a low percentage of ripple from a source of single-phase alternating current to a load having a substantially predetermined normal operating impedance comprising a first and a second transformer each having a primary winding and a secondary winding, one end of the primary winding of said first transformer being connected to one end of the primary winding of said second transformer and said one end being adapted to be connected to one terminal of a source of single-phase alternating current, a capacitor, one plate of said capacitor being connected to the other end of said primary winding of said first transformer, the other plate of said capacitor being adapted to be connected to the other terminal of said source of single-phase alternating current, an inductor, one end of said inductor being connected to the other end of said primary winding of said second transformer, the other end of said inductor being connected to said other plate of said capacitor, said secondary winding of said transformer being centertapped, one end of said secondary winding of said first transformer being connected to said centertap on the secondary winding of said second transformer, the other end of the secondary winding of said first transformer and the ends of the secondary winding of said second transformer being connected to a three phase, full wave rectifier, the secondary winding of said first transformer bearing a relation to the primary winding thereof and to the second transformer such that the voltage induced in said secondary winding of said first transformer bears a relationship to the voltage induced in the secondary winding of said second transformer as $\frac{1}{2}\sqrt{3}:1$, and said rectifier having unidirectional current output connections adapted to be connected to said substantially predetermined load impedance, said capacitor and said inductor having values of capacitance and inductance respectively chosen so as to produce a substantially symmetrical polyphase input voltage to said polyphase rectifier for said substantially predetermined load impedance in order to produce substantially a minimum of ripple in the voltage output of said rectifier fed to said load impedance.

3. A power supply as defined in claim 2 further including a second capacitor in parallel with the voltage output of said rectifier having a capacity sufficient to further filter the direct current output of said rectifier.

4. A method of powering a thermoelectric refrigeration device from a single-phase line which device includes a thermoelectric junction and an associated unidirectional current power supply for cooling an area to be conditioned and wherein said thermoelectric device presents a substantially predetermined load impedance to its associated power supply, which comprises the steps of: converting a single-phase current into a polyphase current, rectifying said polyphase current, and supplying said rectified polyphase current to said thermoelectric device whereby a minimal amount of filtering is required to provide effective operation of said system.

5. In a thermoelectric system, a thermoelectric device requiring relatively ripple free unidirectional current for efficient operation, a phase splitter for converting single-phase alternating current to a substantially balanced polyphase alternating current output, a polyphase rectifier for converting a substantially polyphase alternating current input to a unidirectional current output having relatively low ripple, means to supply the polyphase output of said phase splitter to the input of said rectifier, means to supply the unidirectional current output of said rectifier to said thermoelectric device and means to supply a single-phase alternating current input to said phase splitter so that said thermoelectric system is efficiently operable from a single phase current line.

6. In combination with a thermoelectric device of the type requiring a unidirectional current having relatively low ripple for efficient operation, a polyphase rectifier having input and output terminals and a phase splitter to convert a single-phase alternating current input to a substantially balanced polyphase alternating current output, the polyphase output of said phase splitter being supplied to the input terminals of said rectifier, and the thermoelectric device being connected to the output terminals of said rectifier whereby unidirectional current having relatively low ripple may be supplied to said thermoelectric device from a single-phase alternating current line.

7. A thermoelectric system adapted for cooling of a desired area which comprises a plurality of thermoelectric elements having dissimilar thermoelectric properties electrically connected together in alternating series fashion forming junctions of a type which are adapted to be cooled upon the passage therethrough of a unidirectional current of a predetermined polarity and arranged in heat exchange relation with said area, said electrically connected thermoelectric elements exhibiting a substantially predetermined load impedance, means to supply a unidirectional current having low ripple to said thermoelectric elements, said means comprising a polyphase rectifier and a phase-splitting network each having input and output ends, the input end of said phase-splitting network being adapted to be connected to a source of single-phase alternating current and the output end of said network being connected to the input end of said rectifier, said thermoelectric elements being electrically connected to the output end of said rectifier to derive current therefrom, said network comprising components selected so as to supply a substantially symmetrical polyphase alternating current to the input of said rectifier from said single-phase source for the predetermined impedance of said thermoelectric elements which comprise the load on said rectifier so that the output current of said rectifier contains substantially a minimum of ripple.

8. A thermoelectric system as defined in claim 7 wherein said rectifier comprises a full-wave polyphase rectifier and a capacitor is connected in parallel with said thermoelectric elements and said output side of said rectifier, said capacitor having a capacitance sufficient to further reduce the ripple in the unidirectional current output of said rectifier.

References Cited in the file of this patent

UNITED STATES PATENTS

| | | |
|---|---|---|
| 492,480 | Bradley | Feb. 28, 1893 |
| 551,809 | Bradley | Dec. 24, 1895 |
| 1,723,583 | Shoemaker | Aug. 6, 1929 |
| 2,255,378 | Colchester | Sept. 9, 1941 |
| 2,837,899 | Lindenblad | June 10, 1958 |